United States Patent
Popescu (10) Patent No.: US 10,302,713 B2
(45) Date of Patent: May 28, 2019

(54) METHOD AND MAGNETIC RESONANCE APPARATUS FOR DETERMINING ABSOLUTE RECEIVE SENSITIVITY MAPS FOR RECEPTION COILS

(71) Applicant: Siemens Aktiengesellschaft, Munich (DE)

(72) Inventor: Stefan Popescu, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 381 days.

(21) Appl. No.: 15/051,999

(22) Filed: Feb. 24, 2016

(65) Prior Publication Data

US 2016/0245882 A1 Aug. 25, 2016

(30) Foreign Application Priority Data

Feb. 24, 2015 (DE) .......................... 10 2015 203 306

(51) Int. Cl.
| | |
|---|---|
| *G01V 3/00* | (2006.01) |
| *G01R 33/24* | (2006.01) |
| *G01R 33/561* | (2006.01) |
| *G01R 33/565* | (2006.01) |

(52) U.S. Cl.
CPC ........ *G01R 33/246* (2013.01); *G01R 33/5611* (2013.01); *G01R 33/5659* (2013.01)

(58) Field of Classification Search
CPC .............. G01R 33/543; G01R 33/5659; G01R 33/3415; G01R 33/36; A61B 5/055
USPC ....................................................... 324/309
See application file for complete search history.

(56) References Cited

U.S. PATENT DOCUMENTS

| | | | | |
|---|---|---|---|---|
| 6,052,611 | A * | 4/2000 | Yanof | A61B 90/10 378/207 |
| 6,275,722 | B1 * | 8/2001 | Martin | G01R 33/34084 324/308 |
| 2004/0070394 | A1 * | 4/2004 | Gonzalez Ballester | G01R 33/3415 324/307 |

(Continued)

OTHER PUBLICATIONS

Van De Moortele et al., "Calibration Tools for RF Shim at Very High Field with Multiple Element RF Coils: from Ultra Fast Local Relative Phase to Absolute Magnitude B1+ Mapping," Proc. Intl. Soc. Mag. Reson. Med., vol. 15, p. 1676 (2007).

Jin et al., "Inverse field-based approach for simultaneous B1 mapping at high fields—A phantom based study," J. Magn. Reson., vol. 217, pp. 27-35 (2012).

(Continued)

*Primary Examiner* — Walter L Lindsay, Jr.
*Assistant Examiner* — Frederick Wenderoth
(74) *Attorney, Agent, or Firm* — Schiff Hardin LLP (57) ABSTRACT

In a method and magnetic resonance apparatus for determining absolute three-dimensional reception sensitivity maps for reception coils in a scanner of the magnetic resonance, in particular a scanner having a basic magnetic field strength of at least 3 T, in the presence of a subject under examination that affects the reception sensitivity, spatially resolved subject parameters are determined, which specify electromagnetic properties of the subject under examination, and coil-geometry parameters are determined, which specify the spatial arrangement of the reception coils in the magnetic resonance scanner. The reception sensitivity maps are determined by simulation in a model specified by the subject parameters and the coil-geometry parameters.

20 Claims, 2 Drawing Sheets

(56) References Cited

U.S. PATENT DOCUMENTS

| | | | | |
|---|---|---|---|---|
| 2005/0096534 | A1* | 5/2005 | Zhu | G01R 33/5611 600/422 |
| 2005/0245814 | A1* | 11/2005 | Anderson | A61B 5/06 600/410 |
| 2006/0197528 | A1* | 9/2006 | Bielmeier | G01R 33/28 324/314 |
| 2009/0224756 | A1* | 9/2009 | Machida | G01R 33/3415 324/300 |
| 2009/0278536 | A1* | 11/2009 | Winkelmann | G01R 33/3415 324/309 |
| 2011/0103668 | A1* | 5/2011 | Uchizono | G01R 33/561 382/131 |
| 2011/0148410 | A1* | 6/2011 | Zaitsev | G01R 33/5611 324/309 |
| 2012/0146637 | A1 | 6/2012 | Zhu et al. | |
| 2012/0150458 | A1 | 6/2012 | Sodickson et al. | |
| 2012/0179023 | A1 | 7/2012 | Fuderer et al. | |
| 2013/0251227 | A1 | 9/2013 | Wang et al. | |
| 2015/0241372 | A1* | 8/2015 | Feldkamp | A61B 5/0522 702/65 |

OTHER PUBLICATIONS

Marques et al., "Single Acquisition Electrical Property Mapping Based on Relative Coil Sensitivities: A Proof-of-Concept Demonstration," Magnetic Resonance in Medicine, vol. 74, pp. 185-195 (2015).

Zhang et al., "Magnetic-Resonance-Based Electrical Properties Tomography: A Review," IEEE Reviews in Biomedical Engineering, vol. 7, pp. 87-96 (2014).

Voigt, "Imaging Conductivity using Electric Properties Tomography—Initial Clinical Results in Glioma Patients," IEEE Transactions on General Assembly and Scientific Symposium (2011).

Scott et al., "Rotating Frame RF Current Density Imaging," Magnetic Resonance in Medicine, vol. 33, pp. 355-369 (1995).

Muftuler et al., "MREIT with SENSE acceleration using a dedicated RF coil design," Physiological Measurement, vol. 30, pp. 913-929 (2009).

Ammari et al., "Mathematical Models and Reconstruction Methods in Magneto-Acoustic Imaging*," European Journal of Applied Mathematics, vol. 20, pp. 303-317 (2009).

* cited by examiner

METHOD AND MAGNETIC RESONANCE APPARATUS FOR DETERMINING ABSOLUTE RECEIVE SENSITIVITY MAPS FOR RECEPTION COILS

BACKGROUND OF THE INVENTION

Field of the Invention

The invention concerns a method for determining absolute three-dimensional reception sensitivity maps for reception coils in a magnetic resonance apparatus, in particular in a magnetic resonance apparatus having a basic magnetic field strength of at least 3 T, in the presence of a subject under examination that affects the reception sensitivity. The invention also relates to a magnetic resonance apparatus for implementing such a method.

Description of the Prior Art

Inhomogeneities in the magnetic resonance fields used to acquire raw data in a magnetic resonance scanner are a common cause of image artifacts in the magnetic resonance image. The field inhomogeneities, which result in image inhomogeneities, cause a particular problem when the basic magnetic field (B0 field) has a field strength of at least 3 T. If a subject under examination, in particular a patient, is brought into the magnetic resonance scanner and hence into the basic magnetic field, electrical effects arise that may influence the transmission and reception properties of the RF coils used, and are visible as shading in the reconstructed magnetic resonance datasets. This shading can conceal the underlying anatomy or make it harder to discern, and is hence detrimental to a reliable diagnostic assessment.

The reason why there is a sharp increase in the image artifacts resulting from inhomogeneities in the RF field (B1 field), produced by the RF coils, at higher basic magnetic field strengths, in particular field strengths of at least 3 T, is that in such strong fields, the wavelengths at the Larmor frequency become comparable to the dimensions of the subject under investigation, in particular a patient, and the electromagnetic properties of human tissue affect the ultimate distribution of the RF fields inside the body, which results in the inhomogeneity side-effects in magnetic resonance imaging.

The shading problem can be thought of as having two separate components: one component that arises in the radiation of the RF pulses via transmit coils (TX), and another component arising from the influence of dielectric effects on the reception behavior, i.e. the reception sensitivity, of the reception coils. In the transmit case, the dielectric effects interact at high field strengths to produce an inhomogeneous distribution of the emitted RF power inside the body, which results in erroneous flip angles in the imaging volume and hence in unwanted modulation of the original magnetic resonance signals in the tissue by the sine of the flip angle. As noted above, these effects are far weaker at lower field strengths, for example at 1.5 T, and can be ignored. In order to combat these transmit (TX) effects for higher field strengths, for example field strengths of at least 3 T, the prior art proposes parallel transmission (pTX) techniques for the emission of RF pulses for the purpose of pre-calibrating the transmit profile of a number of transmit antennas, i.e. to measure the emitted B1 fields (which are then often referred to as $B1^+$ maps). Such data are then used to pre-distort the emitted RF fields so that then a homogeneous excitation, i.e. a homogeneous distribution of the flip angles, occurs in the target area from which raw data are to be acquired.

As also noted, however, the same dielectric effects also affect the reception component of the magnetic resonance examination because the reception sensitivity of the reception coils (often referred to as $B1^-$ maps) depends on the originally unknown anatomy that is meant to be imaged. The effects are primarily determined by the distribution of the electrical conductivity $\sigma$ and the permittivity (dielectric constant) $\varepsilon$ in the tissue.

The latest magnetic resonance imaging techniques are essentially based on having coil sensitivity information available that is as accurate as possible in order to be able to correct RF-related image homogeneities. It is precisely in the receive case (RX), however, that often only relative reception sensitivity maps are available for reception coils. If the relaxation-free signal intensity at a specific position is considered for a single transmit/reception coil (TX/RX coil), it normally depends not only on the tissue contrast and the flip angle, but also on the positive (for TX) and negative (for RX) circularly polarized components of the transverse RF magnetic field. The main obstacle to determining absolute transmit/reception sensitivity maps lies in the interdependence of the transmission sensitivity (described by the $B1^+$ map), the reception sensitivity (described by the $B1^-$ map) and the image contrast, as given by the equations known in the prior art. It should be noted here that in addition, the flip angle of course depends on the magnitude of the RF transmission field (and hence on the transmit sensitivity). Known techniques measure only the magnitude of $B1^+$ but not the phase of $B1^+$.

It would be possible to solve this problem using an enhanced technique in which the entire arrangement of coils and subject under examination is rotated with respect to the direction of the basic magnetic field (B0 field). The z-component of the RF field for the transmit and receive sensitivities could then be introduced into the equations. For such a case, there are mathematical analyses that show that six rotations are needed to determine the entire RF vector field and hence to determine the absolute transmission and reception sensitivity information. Such an approach, however, is obviously unsuitable for examining patients in the patient receiving area of a magnetic resonance scanner of a magnetic resonance apparatus.

The use of reception sensitivity maps for reception coils becomes particularly important in acceleration techniques used in parallel imaging, known as accelerated PAT (parallel acquisition technique). Such acceleration techniques are based on using multiple reception coils in parallel (pRX) that have very different reception sensitivities or, in the ideal case, receive sensitivities that do not overlap spatially. This immediately results in the problem that all PAT image reconstruction techniques require prior knowledge about the actual receive sensitivities of the reception coils. As was explained, however, these reception sensitivity maps also depend on the anatomy to be imaged, in particular the electromagnetic properties thereof It is assumed in the prior art that ultimately it would be impossible to encode the absolute receive sensitivities of the reception coils and the magnetic resonance signals produced by the originally unknown anatomy in such a way that it would be possible to determine absolute reception sensitivity maps.

This is why known PAT reconstruction techniques such as SENSE or GRAPPA use an automatic estimate of relative receive sensitivities of the reception coils, i.e. the ratio of the individual-coil reception sensitivity and a common reference denominator, for example the square root of the sum-of-squares (ROOT-SOS) of all the individual coil sensitivities. In the SENSE technique, the relative reception sensitivity maps are determined in the image domain, whereas the GRAPPA technique uses an implicit and relative relationship between k-space coil sensitivities.

Whereas the approach that uses relative reception sensitivity maps for the reception coils may be adequate for suppressing PAT aliasing artifacts caused by undersampling, the disadvantage with this approach is that the reconstructed magnetic resonance image dataset is still modulated by the reception sensitivity of the (possibly virtual) reference coil, which itself suffers from inhomogeneities. This results in an uneven presentation of the imaged anatomy, i.e.

an inhomogeneous brightness, so that some regions are incorrectly shown as emitting weaker magnetic resonance signals. Such RX shading artifacts even arise when almost-perfect, homogeneous flip-angle distributions are achieved by parallel transmission (pTX).

Two approaches for reducing these artifacts are known in the prior art. One approach proposes providing a post-processing step for the reconstructed magnetic resonance image dataset, which is known as "prescan normalization". In this approach, two additional low-resolution magnetic resonance images are acquired, one using the local reception coils, the other using a whole-body coil operated in reception mode. The main assumption in this correction approach is that the reception sensitivity of the whole-body coil is practically homogeneous over the entire imaging volume. The dielectric effects in magnetic resonance scanners having basic magnetic field strengths of at least 3 T mean, however, that this assumption is erroneous because even for the whole-body coil, reception sensitivity profiles differ widely between different patients and between different areas of examination.

In a second approach, which is known only for acquisitions in the head region, it is assumed that the absolute reception sensitivity maps ($B1^-$ maps) can be determined by mirroring the $B1^+$ maps with respect to the central sagittal plane. Hence the underlying assumption is that the head is right-left symmetrical. This is not generally true, however, which means that errors occur not only when the head is not centrally positioned but also when abnormalities are present such as tumors, stenoses or hemorrhages. In addition, this approach is also subject to further known limitations in the estimate of $B1^+$ maps, namely the need for a number of acquisition processes (scans), which are susceptible to movement, low signal-to-noise ratios and low resolutions. Moreover, the mapping of the transmission sensitivities of the transmit coils supplies only the strength of the $B1^+$ field, while the phase is not generally known and is affected by the phase of the reception chain, eddy-current errors and B0 inhomogeneity.

Hence particularly in the field of PAT image reconstruction techniques such as SENSE or GRAPPA, there is the desire to have available, instead of the conventional relative reception sensitivity maps of the reception coils, with which shading artifacts still occur, absolute reception sensitivity maps, which would make it possible to obtain magnetic resonance image datasets that are free of RF shading artifacts. There are also other applications, however, in which complete knowledge about the RF field or the underlying properties could be useful, for example for SAR quantification.

SUMMARY OF THE INVENTION

Therefore, an object of the invention is to define a way to determine absolute reception sensitivity maps for reception coils in a magnetic resonance apparatus.

In order to achieve this object, the invention provides a method of the type mentioned in the introduction, which is characterized by the following steps.

Spatially resolved subject parameters are determined and provided to a computer, which specify electromagnetic properties of the subject under examination.

Coil-geometry parameters are also determined and provided to the computer, which specify the spatial arrangement of the reception coils in the magnetic resonance scanner.

The computer determines the reception sensitivity maps by simulation in a model specified by the subject parameters and the coil-geometry parameters. The sensitivity maps are made available from the computer in electronic form as a data file.

The method for reception sensitivity mapping in accordance with the invention ($B1^-$ mapping) can be used to achieve improved image reconstruction based thereon, in particular in accelerated parallel imaging techniques (PAT). It is proposed to estimate, i.e. to determine, in the simplest way (described in greater detail below) the distribution of the electromagnetic properties, in particular of the electrical conductivity and of the dielectric constant, within the imaging volume, on the basis of which the absolute reception sensitivity maps can be calculated using numerical simulations and a-priori information about the geometries and positions of the reception coils. Ideally it is possible with the inventive method to determine the subject parameters by magnetic resonance imaging, in particular even as part of the same magnetic resonance imaging procedure that also forms the basis for obtaining the diagnostic image dataset to be reconstructed subsequently.

The invention hence provides absolute receive sensitivities of the reception coils, which can be used by image reconstruction techniques and thus replace relative receive sensitivities. Shading artifacts can thereby be avoided, which means that the image quality of magnetic resonance image datasets is increased considerably for high basic magnetic field strengths of at least 3 T. In addition to using the absolute reception sensitivity maps directly in the reconstruction algorithm, in particular in accelerated parallel imaging techniques, it is also possible to use the reception sensitivity maps to implement reliable image normalization in a post-processing step, which, for instance, may occur after a conventional PAT reconstruction. Finally, such absolute reception sensitivity maps can also be used in other applications, for instance for quantifying the SAR (specific absorption rate), which can also be performed directly on the basis of the subject parameters (to be described in greater detail).

In an embodiment of the present invention, at least some of the subject parameters and/or coil-geometry parameters are obtained from magnetic resonance data that are acquired by the magnetic resonance scanner of the apparatus and specify the subject under examination in three dimensions. It is preferred for at least the subject data to be actually and particularly determined solely from magnetic resonance data acquired by the magnetic resonance scanner, thereby avoiding the need for any additional measuring equipment and the like.

It is preferred, as already indicated, for the magnetic resonance data to be magnetic resonance data that are based on a magnetic resonance image dataset that is to be reconstructed and/or corrected using the reception sensitivity maps. Then advantageously there is no need for any additional acquisition processes using the magnetic resonance scanner, because the subject parameters required can be determined from the magnetic resonance data acquired anyway as part of the examination, and from which the desired magnetic resonance image dataset is reconstructed.

Specifically, it can be provided here that the magnetic resonance data are selected as magnetic resonance data taken from a raw dataset, which magnetic resonance data lies in a region located about the center of the sampled k-space, in particular for undersampled imaging lines in a fully sampled region located about the center of k-space. In the main area of use of the present invention, accelerated parallel imaging, undersampling is often performed in the sampled k-space, with a region about the center of k-space being fully sampled (i.e., all available k-space data entry points in this region are filled with raw data). These fully sampled, central lines in k-space, which are also referred to as autocalibration lines, are normally also used to determine reconstruction parameters in the reconstruction algorithms used in accelerated parallel imaging, particularly SENSE or GRAPPA; for example, the relative reception sensitivity maps of the reception coils are calculated from these autocalibration lines, as is known in the prior art. These provide an excellent basis for determining the subject parameters, as discussed in greater detail below.

There may also be cases in which it is advantageous for the magnetic resonance data to be acquired in a prescan prior to the acquisition of a diagnostic raw dataset forming the basis for the reconstruction of the magnetic resonance image dataset to be used for answering a medical question, in particular as a three-dimensional localizer and/or as an advance dataset used to set acquisition parameters. Thus a prescan is also possible in order to determine the magnetic resonance data forming the basis for obtaining the subject parameters. This is particularly advantageous when the actual imaging is aimed at a two-dimensional magnetic resonance image dataset, but the reception sensitivity maps are needed in three dimensions. Then a three-dimensional prescan can be advantageous. In this context it is possible to use magnetic resonance data from three-dimensional localizers that are acquired anyway, and hence to use the magnetic resonance data also for other purposes, such as for setting acquisition parameters for the subsequent acquisition processes. It should be noted that reception sensitivity maps determined once, after the prescan, can obviously be re-used for all subsequent acquisition processes and/or the results of these acquisition processes in the same configuration.

In a further embodiment of the method according to the invention, relative reception sensitivity maps, in particular relating to a specific reception coil, preferably a whole-body coil, or to a summation of received signals from a number of reception coils, preferably from all the reception coils, are first determined from the magnetic resonance data, from which relative reception sensitivity maps the subject parameters are determined. As noted, one of the main areas of use of the method according to the invention is accelerated parallel imaging, and the conventional reconstruction techniques used therein already, as established practice, determine relative reception sensitivity maps. Therefore, these maps constitute a particularly suitable starting point for deriving the subject parameters, which in turn form a basis for determining the absolute reception sensitivity maps. Only recently it was shown in an entirely different context by Jose P. Marques et al. in "Single Acquisition Electrical Property Mapping Based on Relative Coil Sensitivities: A Proof-of-Concept Demonstration", Magnetic Resonance in Medicine, Early publication, DOI: 10.1002/mrm.25399, that relative reception sensitivity maps of the reception coils are also adequate for mapping electrical properties of a subject under examination. Such a procedure, demonstrated with regard to diagnostic applications, can also be employed advantageously in the present invention, in particular in order to improve image reconstruction in accelerated parallel imaging or to perform a correction in a post-processing step.

Other approaches that make it possible to determine, if applicable using additional measurements, the subject parameters specifying electromagnetic properties of the subject under examination are also possible. For instance, the subject parameters can be determined using electrical impedance imaging (which additionally employs electrodes on the subject under examination), "Electrical Properties Tomography" employing $B1^+$ mapping (which makes the assumption that the transmit and receive phases are identical), local Maxwell tomography, magneto acoustic electrical impedance imaging (which measures the vibration of the tissue by electromagnetic forces), gradient-based EPT (Electrical Parameters Tomography) and/or current density imaging. With regard to the prior art, reference should be made here to the article by Greig C. Scott et al., "Rotating Frame RF Current Density Imaging", MRM 33:355-369 (1995), the unexamined applications US 2012/0146637 A1 and US 2012/0150458 A1, the article by Tobias Voigt, "Imaging Conductivity using Electric Properties Tomography-Initial Clinical Results in Glioma Patients", IEEE Transactions on General Assembly and Scientific Symposium, 2011 XXXth URSI, DOI: 10.1109/URSIGASS.2011.6051346, the article by L. Tugan Muftuler et al., "MREIT with SENSE acceleration using a dedicated RF coil design", Physiol. Meas. 30:913-929 (2009), and the article by Habib Ammari et al., "Mathematical Models and Reconstruction Methods in Magneto-Acoustic Imaging", European Journal of Applied Mathematics 20:303-317 (2009).

At this point, it should again be mentioned that a particular, universal advantage of the present invention is that it is not dependent on a homogeneous whole-body coil or on the assumption that a combination of reception coils has a homogeneous receive profile. Instead, tissue-impedance mapping techniques that have been proposed in a different context are used to determine an at least coarse 3D-map of the distribution of the electrical properties in the region of interest.

In addition, with regard to the coil-geometry parameters, it is possible to use magnetic resonance data to determine these parameters. Hence at least some of the coil-geometry parameters can be determined by detecting magnetic resonance markers in the magnetic resonance data, which markers are provided in and/or on at least some of the reception coils. Particularly for freely-positionable reception coils (local coils), possible options are known for providing such coils with magnetic resonance markers that are visible in the magnetic resonance image, from which markers it is possible to determine position data for the respective reception coils by analyzing the magnetic resonance data. In this case, special substances, for instance in suitable containers, can be used, although it is also possible to use, for instance, MR transponders and the like as magnetic resonance markers. Suitable procedures are known from the prior art and can also be used advantageously in the present invention.

Moreover, it is advantageous for at least some of the coil-geometry parameters to be determined from coil data specifying the type of the reception coil and/or specifying attachment mechanisms used and/or connecting devices used. Such coil data are available at the magnetic resonance scanner, and/or from position data from a coil-position determining system that analyses signals from position sensors and/or position markers on at least some of the reception coils. A large number of possible ways of obtaining information about specific coil positions and determining the extent of reception coils, in particular local coils, are known. For the majority of attached reception coils used in magnetic resonance imaging, for example head coils, body coils or spine coils, the coil-geometry parameters, which specify the position and the coil geometry, are already known. Moreover, it is known that various attachment positions and/or connecting devices can be used that are built into the patient bed, and these are usually equipped with detection devices for establishing whether a coil is connected, and in addition coil information is usually also encoded in the reception coil itself For reception coils that can be positioned as required, in particular anterior coils, the coil geometry is likewise known from the manufacturer's data; the actual coil position relative to the examination volume can be established not only by automatic detection of magnetic resonance markers embedded in the reception coils, as already described, but also by using position sensors and/or position markers assigned to a coil-position determining system. In this case, transponders or the like are possible, which can be integrated in the reception coils, in particular flexible reception coils, in order to establish the current coil position and shape. In addition, such coil-position determining systems can use the magnetic resonance scanner, because magnetic field probes or magnetic field sensors integrated, for example, in reception coils are known, that produce the response signals to gradient pulses used in the magnetic resonance scanner, which can be analyzed in order to establish the current position and orientation of such a position sensor. A wide range of options that have already been suggested from the prior art can also be used in the present invention.

As mentioned, with regard to the electromagnetic properties it can be sufficient to consider solely the "electrical" component of these properties, i.e. to use as the electromagnetic properties the electrical conductivity and/or the dielectric constant, where a refinement to the calculation can also be provided by determining, in addition to the electrical conductivity and the dielectric constant, also the magnetic susceptibility as an electromagnetic property.

The invention then uses numerical simulation techniques in order to solve the complex equations, specifically the Maxwell equations that form the basis of the electromagnetic interactions regarding the reception sensitivity. It is self-evident that the spatial reference for the subject parameters and the coil-geometry parameters is taken to be based on a common coordinate system of the magnetic resonance scanner, the field generation properties of which, with regard to the basic magnetic field and the gradient fields and at least some of the RF fields, are known. Since the inventive method relates primarily to cases in which the basic magnetic field strength is at least 3 T, in an embodiment of the invention a simulation is used that evaluates the Maxwell equations in the wave regime, which means for wavelengths that are smaller than the dimensions of the subject under examination. Thus whereas the known prior art solves the Maxwell equations in the quasi-static regime (wavelength>dimensions of subject), where the RF fields are defined solely by the coil geometry (Biot-Savart model), the present invention uses specifically adapted simulation techniques for the wave regime. In this context, US 2005/0096534 discloses a procedure in which the complete set of Maxwell equations are solved for phantoms having known electromagnetic properties, which document mentions concepts, in particular describes simulation software and/or discrete numerical methods, that can also be used in the present invention.

In a further embodiment of the invention, proceeding from determining the subject parameters from magnetic resonance data acquired in a prescan, the subject parameters are additionally taken into account in determining SAR information, such as an SAR map, relating to at least one upcoming image acquisition process. If the electromagnetic, in particular electrical, properties of the subject under examination, the patient, are known first, and if the acquisition parameters of the image acquisition process intended for examining the patient are known, these properties can be used advantageously to determine local and/or global SAR values for the patient, which is why it is advantageous in this embodiment for the subject parameters to be determined from magnetic resonance data from a prescan, in order then to be able to evaluate accordingly subsequent image acquisition processes with regard to their SAR impacts. The aforementioned calculation methods, in particular a simulation that takes into account the image acquisition parameters (and known properties of the magnetic resonance scanner), can be used here in order to determine the SAR information. This information is preferably determined locally, in particular as an SAR map. It is thereby possible to use the subject parameters also for a second purpose in addition to the use for determining the relative reception sensitivity maps.

It should be mentioned that determining SAR information on the basis of subject parameters can also be advantageous independently of determining relative reception sensitivity maps. The invention thus also encompasses a method for determining SAR information, in particular an SAR map, based on at least one image acquisition process specified by acquisition parameters and performed on patients to be examined as the subject under examination, in a magnetic resonance scanner, in particular a magnetic resonance scanner having a basic magnetic field strength of at least 3 T, which method is characterized by the following steps.

Spatially resolved subject parameters are determined and provided to a computer, which specify electromagnetic properties of the patient, in particular from magnetic resonance data acquired using the magnetic resonance scanner for patients already positioned for the image acquisition process.

The SAR information is determined by the computer by simulation in a model specified by the subject parameters under the conditions specified by the acquisition parameters. The embodiments described above for determining the subject parameters also apply to such a method. In particular, it is advantageous, as mentioned, for the magnetic resonance data to be acquired in a prescan prior to the diagnostic image-acquisition process, preferably as a three-dimensional localizer and/or as an advance dataset used to set acquisition parameters.

As already mentioned, the primary area of use of the present invention is in accelerated parallel imaging techniques (PAT), and therefore the method according to the invention can be developed into a method for reconstructing a magnetic resonance image dataset from magnetic resonance data acquired at least in part by undersampling, using a magnetic resonance scanner operated according to a parallel transmit process employing a number of reception coils, wherein absolute reception sensitivity maps are determined according to the invention as described above and are taken into account in the reconstruction. It is straightforward for those skilled in the art to adapt the reconstruction algorithms, for example SENSE or GRAPPA, to absolute receive sensitivities.

It is also possible, however, to leave untouched the previous reconstruction algorithms, in particular SENSE or GRAPPA, that use relative receive sensitivities, and to develop the method according to the invention into a method for correcting a magnetic resonance image dataset that has already been reconstructed, such as by using relative reception sensitivity maps, from magnetic resonance data acquired, at least in part by undersampling, using a magnetic resonance scanner operated with a parallel transmit process employing a number of reception coils. In such a method, absolute reception sensitivity maps determined according to the invention and are used for image normalization of the reconstructed magnetic resonance image dataset in a post-processing step.

In addition to the described method, the present invention also concerns a magnetic resonance apparatus having a scanner operated by a controller designed to implement the method according to the invention. All the embodiments relating to the method according to the invention apply to the magnetic resonance apparatus according to the invention, and therefore the described advantages can also be achieved by the apparatus. In particular, the controller can have a subject-parameter determining processor, a coil-geometry parameter determining processor and a receive-sensitivity map determining processor. In further embodiments, a reconstruction processor and/or a correction processor can also be provided as part of the controller. These processors need not be individual or separate, and can be combined or shared in many combinations The present invention also encompasses a non-transitory, computer-readable data storage medium encoded with programming instructions that, when the storage medium is loaded into a computer, cause the computer to execute any of the methods described above, and all embodiments thereof The storage medium may be, for example, a CD-ROM.

DESCRIPTION OF THE PREFERRED EMBODIMENTS

Figure 1:
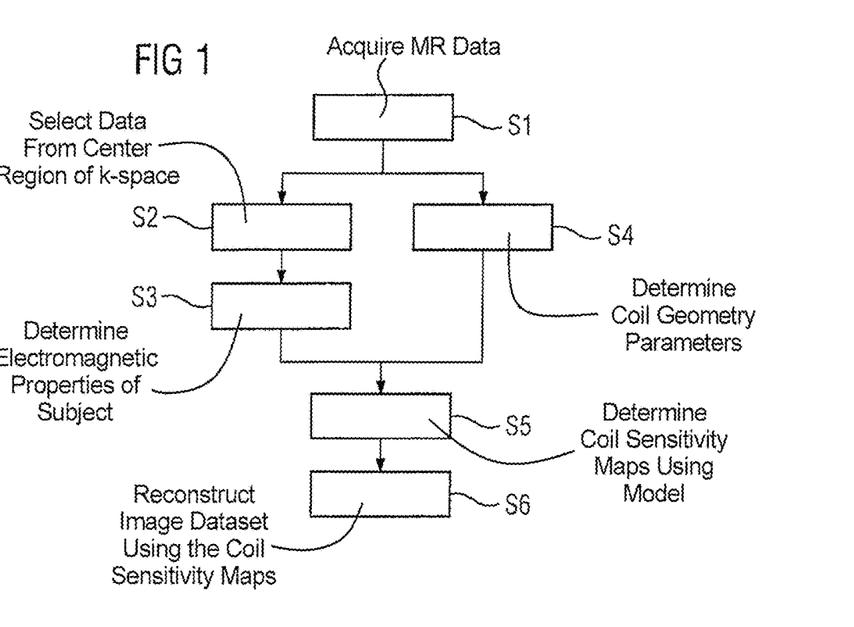
FIG. 1 is a flowchart of a first exemplary embodiment of the method according to the invention.

FIG. 1 shows a flowchart of a first exemplary embodiment of the method according to the invention, as used for improving the reconstruction of magnetic resonance image datasets in accelerated parallel imaging (PAT). In a first, generally known step S1 of this method, magnetic resonance data are acquired that will form the basis of the magnetic resonance image dataset to be reconstructed later. In this process, a region about the center of k-space is fully sampled, whereas undersampling exists outside this region.

In a step S2, the magnetic resonance data from the fully sampled region about the k-space center (also known as autocalibration lines) are used to determine relative reception sensitivity maps for the number of reception coils used; the reference value used here is the square root of the sum-of-squares of all the individual coil sensitivities (ROOT-SOS).

In a step S3, the procedure described in the above-cited article by José P. Marques is used to determine as the electromagnetic properties of the subject under examination, spatially resolved, an electrical conductivity and a dielectric constant as the subject parameters, from the relative receive sensitivities. Hence the subject parameters comprise a three-dimensional electrical conductivity map and a three-dimensional electrical dielectric-constant map. The spatial resolution here relates to the coordinate system of the magnetic resonance scanner, in which system the field generation properties of the scanner are also known.

In a step S4 shown in parallel, the coil-geometry parameters specifying the geometry and the spatial position of the reception coils are determined, where again in this case at least some of the magnetic resonance data acquired in step S1 can be used if magnetic resonance markers are fitted in at least some of the coils. For built-in reception coils and/or reception coils to be connected at specific points in a defined manner (as local coils), at least some of the coil-geometry parameters are already known anyway in the magnetic resonance scanner, where, for example, the attachment mechanisms and/or connecting devices used provide more detailed information; the geometry of the reception coils is usually specified by the manufacturer. For freely positionable reception coils, for instance anterior local coils, apart from using magnetic resonance markers to determine the position of the coils (and also the shape of flexible coils) it is also possible to use coil-position determining systems, which preferably employ magnetic field sensors inside the reception coils, which sensors also respond to the gradient pulses of the magnetic resonance scanner. There are, however, also other options, which are generally known in the prior art, that can be used to determine as fully as possible the geometry and position of the reception coils (once again in the coordinate system of the magnetic resonance scanner).

Since subject parameters and coil-geometry parameters are now available, absolute reception sensitivity maps for the individual reception coils, i.e. B1 maps, are determined from these parameters in a step S5. This is done by using the subject parameters, the coil-geometry parameters and the known properties of the magnetic resonance scanner to create a model, in which model the Maxwell equations can be solved in the wave regime by numerical simulation. In all the exemplary embodiments mentioned herein, the basic magnetic field strength in the magnetic resonance scanner is at least 3 T, and therefore the dimensions of the subject under examination, in particular of a patient, and the wavelengths are of the same order of magnitude, and hence a solution in the wave regime is required. The result of the numerical simulation process in the step S5 is an absolute reception sensitivity map for each reception coil.

In step 6, the magnetic resonance image dataset is reconstructed from the magnetic resonance data acquired in step S1, although this step does not use relative reception sensitivity maps as is generally known, but uses the absolute reception sensitivity maps determined in the step S5. This requires only minimal modification to the reconstruction algorithms used, which algorithms may include a SENSE algorithm or GRAPPA algorithm for instance. Shading artifacts in the reconstructed magnetic resonance image dataset are considerably reduced or are even removed entirely as a result of the absolute reception sensitivity maps used.

Figure 2:
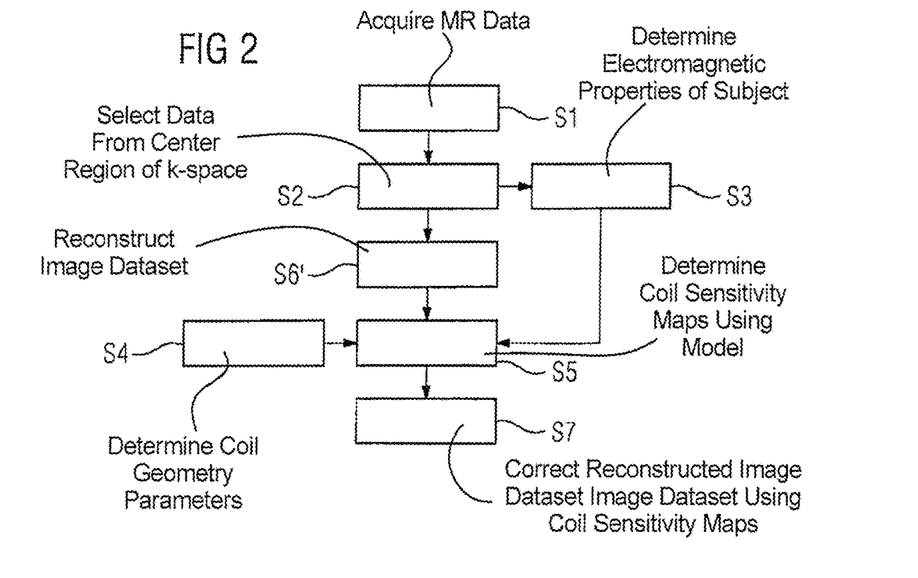
FIG. 2 is a flowchart of a second exemplary embodiment of the method according to the invention.

FIG. 2 shows a slightly modified exemplary embodiment compared with FIG. 1. Again in the first step S1, the three-dimensional magnetic resonance data are acquired in the same manner as the exemplary embodiment of FIG. 1; the steps S2, S3 and S4 are also basically identical except for any difference in their chronological order. In this embodiment, however, the absolute reception sensitivity maps can be determined in the step S5 also after the reconstruction of the magnetic resonance image dataset in the step S6', because initially only the relative reception sensitivity maps determined in the step S2 are used for the reconstruction, as is generally known.

Figure 3:
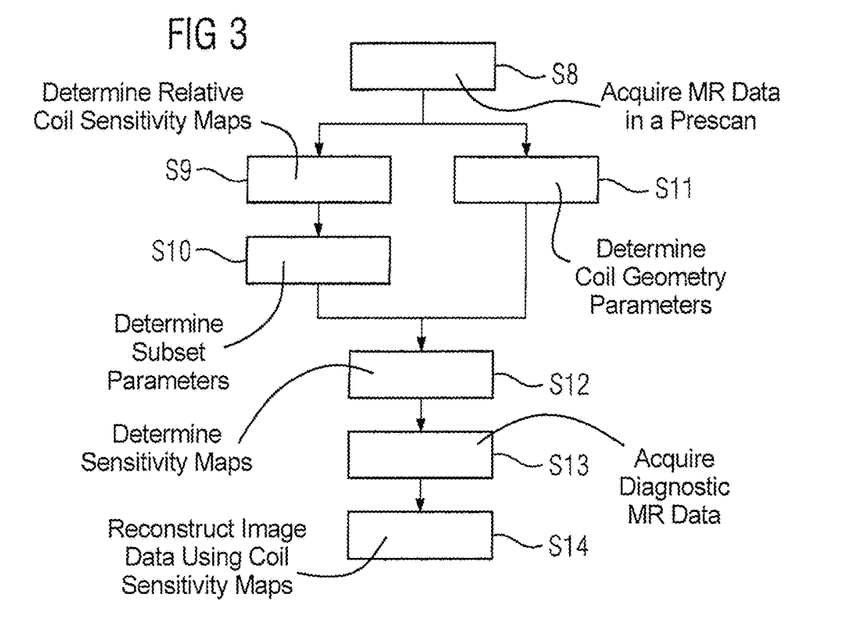
FIG. 3 is a flowchart of a third exemplary embodiment of the method according to the invention.

The absolute sensitivity maps, which are determined in the step S5, are not needed until a post-processing step, the step S7, in which they serve as the basis for an image normalization for retrospective removal of shading artifacts The exemplary embodiments shown so far, of which the first exemplary embodiment is preferred, relate to the acquisition of three-dimensional magnetic resonance image datasets. The third exemplary embodiment shown in FIG. 3 is extremely advantageous for the planned acquisition of two-dimensional magnetic resonance image datasets, but is not limited to this case. Since the absolute reception sensitivity maps are needed in three dimensions, magnetic resonance data in a three-dimensional localizer are first acquired in a prescan in a step S8, which data can also be used to determine other acquisition parameters of the magnetic resonance scanner. Although this data usually has a coarse resolution, it is still adequate for determining a good estimate of absolute reception sensitivity maps. The magnetic resonance data determined in the step S8 are accordingly used again, in a step S9, to determine relative reception sensitivity maps, from which the subject parameters can be derived, in the step S10, in a similar way to the step S3. The step S11 is analogous to the step S4 and is used to determine the coil-geometry parameters, at least some of which of course can also be derived from the magnetic resonance data determined in step S8.

In a step S12, analogous to the step S5, absolute reception sensitivity maps are again determined for the individual reception coils.

Only then, in a step S13, is the actual diagnostic magnetic resonance data acquired, in which acquisition the configuration of the subject under examination and of the reception coils should obviously not change. In a step S14, a high-quality, low-artifact magnetic resonance image dataset can again be obtained from the magnetic resonance data acquired in step S13, whether by using the absolute reception sensitivity maps at the reconstruction stage or not until a post-processing step.

Figure 4:
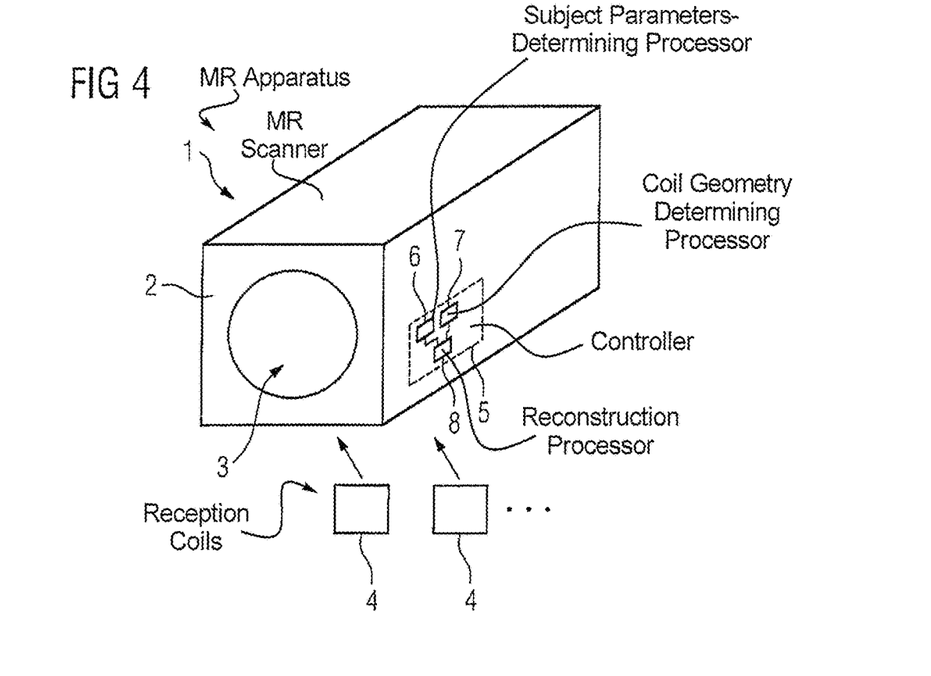
FIG. 4 shows a magnetic resonance apparatus according to the invention.

Finally, FIG. 4 shows a schematic diagram of a magnetic resonance apparatus 1 according to the invention, which, as is generally known, has a scanner 2 with a basic field magnet that defines a patient receiving area 3 into which the patient can be moved using a patient bed (not shown in detail) for the examination. A gradient coil assembly and an RF coil assembly are provided in the scanner 2 around the patient receiving area 3. The basic magnetic field strength (B0 field strength) of the magnetic resonance scanner 2 is at least 3 T. For parallel receive techniques, in particular accelerated parallel imaging, reception coils 4, in particular in the form of local coils, can additionally be introduced into the patient receiving area 3, such as arranged on the patient and/or attached/connected to the patient bed. It is also possible that some reception coils are already built into the magnetic resonance scanner 2.

The operation of the magnetic resonance apparatus 1 is controlled by a controller 5, designed to implement the method according to the invention. The controller 5 for this purpose has a subject-parameter determining processor 6, which is designed to determine spatially resolved subject parameters specifying electromagnetic properties of the subject, a coil-geometry parameter determining processor 7, which is designed to determine coil-geometry parameters specifying the spatial arrangement of the reception coils 4 in the magnetic resonance scanner 2, and a receive-sensitivity map determining processor 8, which is connected to the subject-parameter determining processor 6 and to the coil-geometry parameter determining processor 7 and that uses the subject parameters and the coil-geometry parameters to determine the absolute reception sensitivity maps of the reception coils 4 by simulation. Such maps can then be used in reconstruction and/or post-processing in image acquisitions from the accelerated parallel imaging. The absolute reception sensitivity maps can also be put to a different use.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for determining absolute three-dimensional reception sensitivity maps for reception coils of a magnetic resonance scanner of a magnetic resonance apparatus, wherein said scanner comprises a basic field magnet that generates a basic magnetic field, said method comprising:
   providing a computer with spatially resolved subject parameters that specify electromagnetic properties of a subject to be examined;
   in said computer, determining coil geometry parameters that specify a spatial arrangement of the reception coils in the scanner;
   in said computer, determining a respective absolute reception sensitivity map for each of said reception coils by simulation in a model specified by the subject parameters and the coil geometry parameters of the respective reception coil for which the sensitivity map is determined, independent of the electromagnetic properties and coil geometry parameters of any other of said reception coils; and
   making the absolute reception sensitivity maps available from the computer in electronic form as a data file.

2. A method as claimed in claim 1 comprising acquiring at least some parameters, among the subject parameters and the coil geometry parameters, from three-dimensional magnetic resonance data acquired by operation of said scanner.

3. A method as claimed in claim 2 comprising selecting said magnetic resonance data from a magnetic resonance image dataset used as a basis for at least one of reconstruction and correction of a magnetic resonance image while using the absolute reception sensitivity maps.

4. A method as claimed in claim 3 comprising operating said magnetic resonance scanner to enter said magnetic resonance data as a raw magnetic resonance dataset in an electronic memory organized as k-space, by sampling data entry points in k-space, and selecting said magnetic resonance data that represents at least some of said parameters as data entered into a region of k-space around a center of k-space.

5. A method as claimed in claim 4 comprising entering said raw magnetic resonance data into k-space in respective k-space lines with undersampling that causes some of said k-space lines to be undersampled, and selecting said magnetic resonance data that represents said at least some of said parameters from a fully sampled region around the center of k-space.

6. A method as claimed in claim 2 comprising acquiring said magnetic resonance data that represents said at least some of said parameters by operating said scanner in a prescan, prior to acquiring diagnostic data for reconstruction of a magnetic resonance image dataset.

7. A method as claimed in claim 6 comprising acquiring said magnetic resonance data by operating said scanner to execute a scan selected from the group consisting of a three-dimensional localizer scan and an advanced dataset used to set acquisition parameters for said diagnostic data acquisition.

8. A method as claimed in claim 2 comprising, in said computer, determining relative reception sensitivity maps with respect to a reference, from said magnetic resonance data representing said at least some of said parameters.

9. A method as claimed in claim 8 comprising using a specified reception coil, among said reception coils of said scanner, as said reference.

10. A method as claimed in claim 9 comprising using a whole body coil of said scanner as said specified coil.

11. A method as claimed in claim 8 comprising using a summation of respective reception signals received from a plurality of said reception coils as said reference.

12. A method as claimed in claim 11 wherein said plurality of reception coils is all of said reception coils.

13. A method as claimed in claim 2 comprising acquiring at least some of said coil geometry parameters by operating said scanner to detect magnetic resonance signals originating from magnetic resonance-detectable markers physically associated with at least some of said reception coils.

14. A method as claimed in claim 1 comprising determining at least some of said coil geometry parameters from data available to the scanner selected from the group consisting of coil data specifying a coil type, coil data specifying an attachment mechanism used to mount respective reception coils in said scanner, and data representing connecting devices used to make electrical connections for respective reception coils, and position data from a coil position determining system that analyzes signals from at least one of coil position sensors and coil position markers physically associated with at least some of said reception coils.

15. A method as claimed in claim 1 comprising selecting said electromagnetic properties as electrical conductivity of tissue in the subject, dielectric constants of tissue of the subject, and magnetic susceptibility of tissue of the subject.

16. A method as claimed in claim 1 comprising, in said simulation, evaluating Maxwell equations in the wave regime to obtain said absolute coil sensitivity maps.

17. A method as claimed in claim 1 comprising, in said computer, also using said subject parameters to determine SAR information for a subsequent diagnostic scan of the subject with said scanner.

18. A method for reconstructing a magnetic resonance image dataset from a subject, comprising:
providing a computer with spatially resolved subject parameters that specify electromagnetic properties of a subject to be examined;
in said computer, determining coil geometry parameters that specify a spatial arrangement of the reception coils in a magnetic resonance data acquisition scanner;
in said computer, determining a respective absolute reception sensitivity map for each of said reception coils by simulation in a model specified by the subject parameters and the coil geometry parameters of the respective reception coil for which the sensitivity map is determined, independent of the electromagnetic properties and coil geometry parameters of any other of said reception coils;
operating said scanner to acquire magnetic resonance data from the subject using a parallel transmit procedure with a plurality of said reception coils;
executing an image reconstruction algorithm in said computer using the absolute respective coil sensitivity maps to reconstruct a magnetic resonance image of the subject from the magnetic resonance data acquired using said parallel transmit process; and
making the reconstructed magnetic resonance image of the subject available in electronic form from the computer as a data file.

19. A method for correcting a magnetic resonance image dataset from a subject, comprising:
providing a computer with spatially resolved subject parameters that specify electromagnetic properties of a subject to be examined;
in said computer, determining coil geometry parameters that specify a spatial arrangement of the reception coils in the scanner;
in said computer, determining a respective absolute reception sensitivity map for each of said reception coils by simulation in a model specified by the subject parameters and the coil geometry parameters of the respective reception coil for which the sensitivity map is determined, independent of the electromagnetic properties and coil geometry parameters of any other of said reception coils;
operating said scanner to acquire magnetic resonance data from the subject using a parallel transmit procedure with a plurality of said reception coils;
executing an image reconstruction algorithm in said computer to reconstruct a magnetic resonance image of the subject from the magnetic resonance data acquired using said parallel transmit process;
executing a correction algorithm in said computer to correct the reconstructed magnetic resonance image of the subject using the respective absolute coil sensitivity maps; and
making the corrected reconstructed magnetic resonance image of the subject available from the computer in electronic form as a data file.

20. A magnetic resonance apparatus comprising:
a magnetic resonance scanner comprising a plurality of reception coils, each of said reception coils having an individual reception coil sensitivity;
a computer provided with spatially resolved subject parameters that specify electromagnetic properties of a subject to be examined;
said computer being configured to determine coil geometry parameters that specify a spatial arrangement of the reception coils in the scanner;
said computer being configured to determine a respective absolute reception sensitivity map for each of said reception coils by simulation in a model specified by the subject parameters and the coil geometry parameters of the respective reception coil for which the sensitivity map is determined, independent of the electromagnetic properties and coil geometry parameters of any other of said reception coils; and
said computer being configured to make the absolute reception sensitivity maps available from the computer in electronic form as a data file.

* * * * *